(12) United States Patent  (10) Patent No.: US 12,295,183 B2
Kim et al.  (45) Date of Patent: May 6, 2025

(54) COLOR SOLAR CELL MODULE

(71) Applicant: KOREA UNIVERSITY RESEARCH AND BUSINESS FOUNDATION, Seoul (KR)

(72) Inventors: Donghwan Kim, Gyeonggi-do (KR); Hae-Seok Lee, Seoul (KR); Yongseok Jun, Seoul (KR); Yoonmook Kang, Seoul (KR); Yujin Jung, Seoul (KR); Jongwon Ko, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 17/966,023

(22) Filed: Oct. 14, 2022

(65) Prior Publication Data
US 2023/0048108 A1    Feb. 16, 2023

Related U.S. Application Data

(63) Continuation of application No. PCT/KR2020/019370, filed on Dec. 30, 2020.

(30) Foreign Application Priority Data

Feb. 14, 2020 (KR) .................... 10-2020-0018062

(51) Int. Cl.
H10F 77/30 (2025.01)
H10F 30/21 (2025.01)
(52) U.S. Cl.
CPC ......... *H10F 77/331* (2025.01); *H10F 30/289* (2025.01)

(58) Field of Classification Search
None
See application file for complete search history.

(56) References Cited

U.S. PATENT DOCUMENTS

2011/0023937 A1* 2/2011 Daniel .................... G09F 23/00
                                                  136/246
2012/0273030 A1* 11/2012 Jee ......................... H10F 77/488
                                                  136/251
2015/0129015 A1* 5/2015 Maeda .................. H01L 31/056
                                                  136/246

(Continued)

FOREIGN PATENT DOCUMENTS

CN       201590427 U    9/2010
KR     10-0765965 B1    10/2007

(Continued)

OTHER PUBLICATIONS

International Search Report issued on Apr. 9, 2021, for corresponding International Patent Application No. PCT/KR2020/019370, along with an English translation (7 pages).

(Continued)

*Primary Examiner* — Daniel P Malley, Jr.
(74) *Attorney, Agent, or Firm* — Hauptman Ham, LLP

(57) ABSTRACT

Disclosed is a color solar cell module including a transparent substrate, a plurality of solar cells disposed on one side of the transparent substrate and each having a light receiving part, and a color layer disposed on a surface of each of the plurality of solar cells on an opposite side surface of the light receiving part.

13 Claims, 15 Drawing Sheets

(56) References Cited

U.S. PATENT DOCUMENTS

| | | | | |
|---|---|---|---|---|
| 2016/0049904 | A1* | 2/2016 | Sasaki | H01L 31/048 136/251 |
| 2018/0212090 | A1* | 7/2018 | Do | H01L 31/18 |
| 2019/0067504 | A1* | 2/2019 | Needell | H01L 31/02165 |
| 2019/0097069 | A1* | 3/2019 | Kim | H02S 20/26 |

FOREIGN PATENT DOCUMENTS

| | | |
|---|---|---|
| KR | 10-2009-0117879 A | 11/2009 |
| KR | 10-0989285 B1 | 10/2010 |
| KR | 10-2011-0022785 A | 3/2011 |
| KR | 10-2012-0117085 A | 10/2012 |
| KR | 10-2013-0059170 A | 6/2013 |
| KR | 10-1338642 B1 | 12/2013 |
| KR | 10-2015-0053677 A | 5/2015 |
| KR | 10-2015-0092616 A | 8/2015 |
| KR | 10-1543657 B1 | 8/2015 |
| KR | 10-1602922 B1 | 3/2016 |
| KR | 10-1680462 B1 | 11/2016 |
| KR | 10-1700379 B1 | 1/2017 |
| KR | 10-1852237 B1 | 4/2018 |
| KR | 10-2018-0084472 A | 7/2018 |
| KR | 10-1903242 B1 | 10/2018 |
| KR | 10-1917533 B1 | 11/2018 |
| KR | 10-2019-0042405 A | 4/2019 |
| WO | 2011/078630 A2 | 6/2011 |

OTHER PUBLICATIONS

Written Opinion issued on Apr. 9, 2021, for corresponding International Patent Application No. PCT/KR2020/019370 (4 pages).

* cited by examiner

Horizontal arrangement

Vertical arrangement

COLOR SOLAR CELL MODULE

CROSS-REFERENCE TO RELATED APPLICATION

The present application is a Continuation of International Patent Application No. PCT/KR2020/019370, filed on Dec. 30, 2020, which is based upon and claims the benefit of priority to Korean Patent Application No. 10-2020-0018062, filed on Feb. 14, 2020. The disclosures of the above-listed applications are hereby incorporated by reference herein in their entirety.

TECHNICAL FIELD

The present disclosure relates to a color solar cell module.

STATEMENT REGARDING GOVERNMENT SPONSORED RESEARCH OR DEVELOPMENT

There is no property interest of the Korean government in any aspect of this invention.

The present disclosure was derived from a study performed as a part of an energy technology development business (subject serial number: 20193091010240, study management institute: Korea Institute of Energy Technology Evaluation and Planning, study title: Development of transparent solar cell platform that may be easily expanded, managing department: Industry-university cooperation group of Korea University, study period: Sep. 1, 2019 to May 31, 2012, and contribution rate: ½) of Ministry of Trade and Industry of Korea. The present disclosure was derived from a study performed as a part of an new renewable energy core technology development (subject serial number: 20183010014470, study management institute: Korea Institute of Energy Technology Evaluation and Planning, study title: 30 cm×30 cm class ultra-high-efficiency, flexible, and high-stability perovskite solar cell module development, managing department: Industry-university cooperation group of Korea University, study period: 2022.01. 01 to 2023.03.31, contribution rate: ½).

Meanwhile, the present disclosure has no property benefit of Korean Government in all aspects.

BACKGROUND ART

In general, a solar system is a system that converts light energy into electric energy by using solar cells, and is used as an independent power source for general homes or the industries or is used as an auxiliary power source in association with systems of normal AC power sources.

The solar system is a semiconductor device that converts light energy to electric energy by using a photovoltaic effect.

A principle of a general solar cell requires a p-n junction diode, and a basic requirement for a solar cell for conversion of photovoltaic energy requires asymmetric presence of electrons in a semiconductor structure.

For crystalline silicon, generally, a p-n junction is made by depositing an n type material in a diffusion scheme when a P type silicon substrate is used as a base, or by depositing a p type material when an n type silicon substrate is used as a base.

Even in a thin film type solar cell, a p-n junction is formed by depositing films of p and n types on a substrate.

Meanwhile, a plurality of solar cells are connected in series/parallel to each other to generate a voltage and a current that are required by a user, and the user may use electric power generated by the solar cells.

A grid-associated solar system used for a generally used building mounted type includes a plurality of solar cell arrays that convert solar energy into electric energy, and an inverter that converts DC power corresponding to electric energy obtained through conversion in the solar cell arrays to AC power and supplies the AC power to a used place.

In the solar system, installation of the solar cell arrays installed to obtain energy of the sunlight is the most important element in a configuration of the system, and the solar cell arrays are installed at a separately secured place or are installed on the roof of a building.

Accordingly, a separate space has to be secured to install the solar system in a building, but a cooling tower that constitutes a cooling device is generally installed on the roof of the building, and thus a place for installing the solar cell arrays is narrow and limited whereby the installation of the solar cell arrays is restricted and the installation operation is difficult.

There is a case, in which a solar system is applied to a window system installed for lighting and ventilation of a building to supplement the disadvantage.

That is, Korean Patent No. 10-0765965 discloses a window using solar cells.

A conventional window using solar cells will be described with reference to FIG. 1.

FIG. 1 is a perspective view of a conventional window.

Referring to FIG. 1, a conventional window 10 includes a solar cell array 11 that converts solar energy into electric energy, and a frame 11a coupled to a periphery of the solar cell array 11 and mounted in an opening 13 of a wall body 12 of the building.

That is, the conventional window 10 has a structure, in which the solar cell array 11 is fixed to an inner central portion of the frame 11a having a rectangular shape, and an outer glass window located on an outer side of the wall body 12 of the building and an inner glass window located on an inner side thereof are disposed on a front side and a rear side of the solar cell arrays 11 to be spaced apart from the solar cell array 11 by a specific distance and are fixed.

Meanwhile, a device such as a blind or a vertical may be separately installed for privacy when most of the windows are installed, and costs therefor are not low.

In this way, conventionally, the windows and the blinds are separately provided and thus costs or spaces are not efficient.

In recent years, methods for directly installing the blinds to the glass of the building for installation have been suggested.

That is, as illustrated in FIG. 2, it is manufactured by disposing a plurality of solar cells 21 including crystalline or multi-crystalline between reinforced glass boards 22a and 22b, and attaching them by using EVS films 23.

Generally, a front surface of a conventional solar cell module 20 manufactured in this way has a blue color or a black color as illustrated in FIG. 3A, and a rear surface thereof mostly has a gray color as illustrated in FIG. 3B.

In the conventional solar cell module 20, two electrode lines of a width of 3 mm to 5 mm are formed of silver paste Ag through screen printing to form the electrode line 23b on a rear surface of the solar cell 21 and are dried in a roll conveyor employing an infrared (IR) lamp. The color of the electrode line 23b dried in this way is close to a bright gray color.

The solar cells 210 are manufactured by depositing an N-type layer on a P-type wafer or a P-type layer to an N-type wafer. When a P-type is used, rear surfaces of the solar cells 210 have a plus (+) polarity and front surfaces thereof have a minus (−) polarity.

When the solar cell module 20 is manufactured by using the solar cells 21, the solar cells 21 are connected to each other in series or in parallel.

Then, an interconnector ribbon 24 is used to connect the solar cells 21, a material of the interconnector ribbon 24 generally includes Sn+Pb+Ag, Sn+Ag, and Sn+Ag+Cu, and in the case of series connections, a silver paste electrode line 23a of a minus (−) polarity of a width of 3 mm to 5 mm, which is formed on the front surface of a solar cell 21, is connected to a silver paste electrode line 23b of a plus (+) polarity of a width of 3 mm to 5 mm, which is formed on the rear surface of another solar cell through the interconnector ribbon 24.

Meanwhile, when the solar cells are manufactured, the polarities of the front and rear surfaces thereof may be changed according to the kind of the base substrate.

In this way, the interconnector ribbons 24 that connect the solar cells 21 has a width of 1.5 mm to 3 mm and a thickness of 0.01 to 0.2 mm.

The connection methods include an indirect connection method by an IR lamp, a halogen lamp, and hot air and a direct connection method by an iron.

Meanwhile, the EVA film 23 located between glass boards 22a and 22b of the solar cell module 20 starts to be melted at a temperature of 80° C. and becomes clear and transparent at a temperature of about 150° C., joins the solar cells 21 and the glass boards, and prevents corrosion or a short-circuit of the silver electrodes 23a and 23b and the ribbons 24 of the solar cells by preventing external moisture and air that face the solar cells 21 from penetrating.

The EVA film 23 is melt between the dually jointed glass boards 22a and 22b of the solar cell module 20 to be viewed clearly and transparently when being laminated by a laminator (not illustrated), and then, the remaining portions, except for the solar cells 21 and the connection ribbons 24, are viewed clearly.

The conventional solar cell module 20 for BIPV is manufactured by using crystalline or multi-crystalline solar cells 21, and is disposed between the dual glass boards 22a and 22b of the building to be viewed from an inside and an outside of the building as it is.

In this way, a front surface of the solar cell module mounted on a building has a color in a process of forming electrodes through PECVD and APCVD (not illustrated) corresponding to vacuuming equipment and depositing a reflection preventing film through screen printing. Generally, the front surface has a blue color or a black color, but a back-surface field (BSF) of the solar cell module 200 is deposited with aluminum (Al) by vacuuming equipment (not illustrated) to form electrodes, and thus the color becomes a gray color.

Furthermore, in the conventional solar cell module 200, several or several tens of solar cells 21 are connected by the interconnector ribbons 24 in the interiors of the glass boards 22a and 22b, and the interconnector ribbons 24 are not maintained straight constantly and are deflected and curved.

In this state, when the solar cell module 20 is finished through lamination, the shapes of the interconnector ribbons 24 that connect the solar cells 21 in the glass boards 22a and 22b are deflected and uneven as a whole.

Furthermore, the color of the interconnector ribbons 24 of the conventional solar cell module 20 is silver, and when the solar cell module 20 for BIPV is manufactured, the interconnector ribbons 24 have the original color and the front and rear surfaces thereof are exposed in silver.

Accordingly, in the conventional solar cell module 20, the rear surface thereof and the interconnector ribbons 24 have a gray color and a silver color, and because the silver color of the interconnector ribbons 24 is exposed to an outside through the front glass boards 22a and 22b on a front surface of the solar cell module 20, the gray and silver colors of the rear surface is viewed as it is, and the lines of the interconnector ribbons 24 are deflected and curved when the dually joined solar cell module 20 is manufactured, an aesthetic aspect thereof is not good when the solar cell module 20 is attached instead of glass of city buildings.

PRIOR TECHNICAL DOCUMENTS

Patent Documents

[Patent document 001] Korean Patent Application Publication No. 2012-0117085 (Oct. 24, 2012)
[Patent document 002] Korean Patent Application Publication No. 2013-0059170 (Jun. 5, 2013)

DETAILED DESCRIPTION OF THE INVENTION

Technical Problem

An aspect of the present disclosure provides a color solar cell module that may enhance condensing rates of visible rays, near-infrared rays, and ultraviolet rays by installing solar cells in a transparent substrate or a transparent substrate joined to glass in a horizontal arrangement, may enhance condensing rates by installing the solar cells at an equal interval in a vertical line direction that corresponds to a horizontal arrangement with the transparent substrate or the glass, and may secure transparent visibility by installing the solar cells in a range that is not interfered in a range of a field of view of a person.

An aspect of the present disclosure also provides a color solar cell module, in which solar cells are horizontally arranged in a transparent substrate whereby a wideband visual ray transmittance may be absorbed in a balanced way.

An aspect of the present disclosure also provides a color solar cell module that may realize excellent color rendering for a color that is close to natural light based on a high average transmission rate of a wide-band visual ray area, through solar cells.

An aspect of the present disclosure also provides a color solar cell module, in which a plurality of condensing parts are installed in spaces between solar cells in an interior of a transparent substrate to enhance light absorption efficiency by reemitting absorbed light.

The technical problems that are to be solved by the present disclosure are not limited to the above-mentioned ones, and the other technical problems that have not been mentioned will be clearly understood from the following description by an ordinary person in the art, to which the present disclosure pertains.

Technical Solution

According to an embodiment of the present disclosure, a color solar cell module includes a transparent substrate, a plurality of solar cells disposed on one side of the transparent substrate and each having a light receiving part, and a color layer disposed on a surface of each of the plurality of solar cells on an opposite side surface of the light receiving part.

According to another embodiment of the present disclosure, a color solar cell module includes a transparent substrate, a plurality of solar cells disposed on one side of the transparent substrate and each having a light receiving part, and a color layer disposed on one side surface of the transparent substrate, and the sunlight is input from an opposite side of the transparent substrate.

According to another embodiment of the present disclosure, a color solar cell module includes a transparent substrate, a plurality of solar cells disposed on one side of the transparent substrate and each having a light receiving part, a first color layer disposed in each of the plurality of solar cells on an opposite side surface of the light receiving part, and a second color layer disposed on one side surface of the transparent substrate, and the sunlight is input from an opposite side of the transparent substrate.

Furthermore, at least one of the plurality of solar cells may be disposed to be perpendicular to one side surface of the transparent substrate.

Furthermore, the transparent substrate may be divided into an intermediate area, a lower area, and an upper area in a height direction, and the at least one of the plurality of solar cells, which is disposed to be perpendicular to the one side surface of the transparent substrate, may be disposed in the intermediate area.

Furthermore, the solar cells disposed in the lower area and the upper area may be disposed to be inclined toward the intermediate area.

Furthermore, the plurality of solar cells may be disposed to be perpendicular to one side surface of the transparent substrate.

Furthermore, the transparent substrate may be divided into an intermediate area, a lower area, and an upper area in a height direction, and a density of the solar cells disposed in the intermediate area is higher than a density of the solar cells disposed in the lower area and the upper area.

Furthermore, the transparent substrate may be divided into an intermediate area, a lower area, and an upper area in a height direction, and widths of the solar cells disposed in the intermediate area may be larger than widths of the solar cells disposed in the lower area and the upper area.

Furthermore, the one side surface of the transparent substrate may have a preset radius of curvature, and the plurality of solar cells may be disposed on an imaginary line that connects an origin and one side surface of the transparent substrate.

Furthermore, the one side surface of the transparent substrate may be inclined, and the plurality of solar cells may be disposed to be parallel to each other.

Furthermore, the color solar cell module may further include a glass layer disposed on an opposite side surface of the transparent substrate.

Furthermore, the color solar cell module may further include a condensing part disposed in the transparent substrate.

Advantageous Effects of the Invention

According to an embodiment of the present disclosure, condensing rates of visible rays, near-infrared rays, and ultraviolet rays may be enhanced by installing solar cells in a transparent substrate or a transparent substrate joined to glass in a horizontal arrangement, condensing rates may be enhanced by installing the solar cells at an equal interval in a vertical line direction that corresponds to a horizontal arrangement with the transparent substrate or the glass, and transparent visibility may be secured by installing the solar cells in a range that is not interfered in a range of a field of view of a person.

Furthermore, according to an embodiment of the present disclosure, a transmission rate for a visual ray of a wide band may be absorbed in balance by horizontally arranging solar cells in a transparent substrate.

Furthermore, according to an embodiment of the present disclosure, excellent color rendering for a color that is close to natural light may be realized based on a high average transmission rate of a wide-band visual ray area, through solar cells Furthermore, according to an embodiment of the present disclosure, a plurality of condensing parts may be installed in spaces between solar cells in an interior of a transparent substrate to enhance light absorption efficiency by reemitting absorbed light The advantageous effects of the present disclosure are not limited to the above-mentioned ones, and the other advantageous effects will be clearly understood by an ordinary person skilled in the art to which the present disclosure pertains.

BEST MODE

Figure 1:
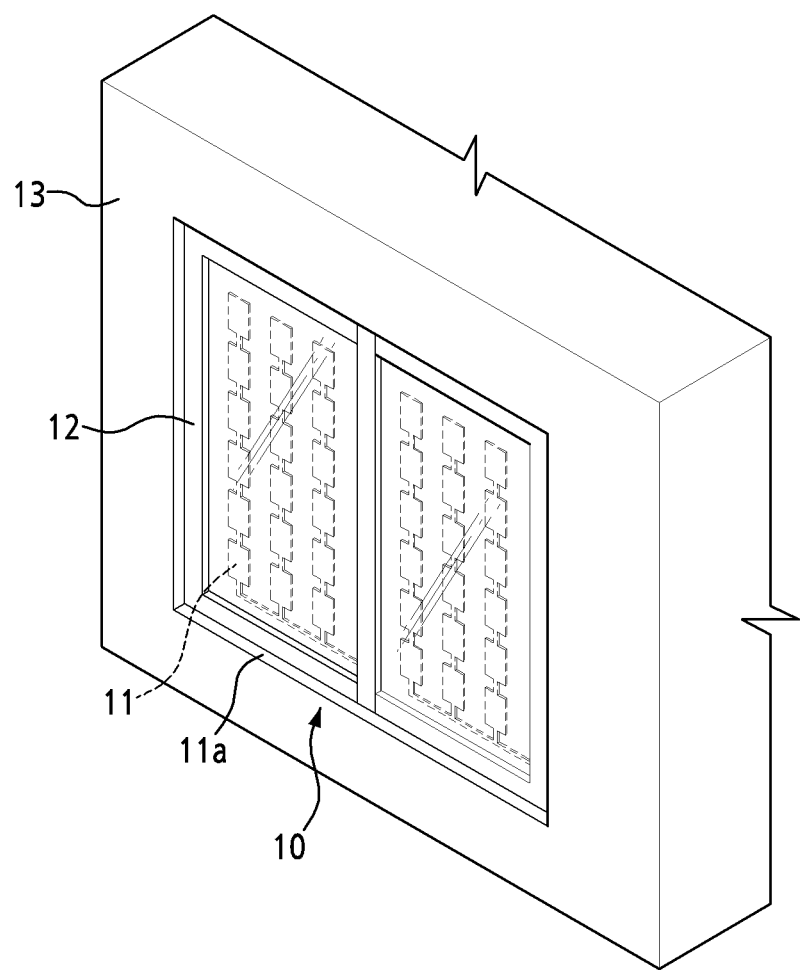
FIG. 1 is a perspective view of a conventional window.
Figure 2:
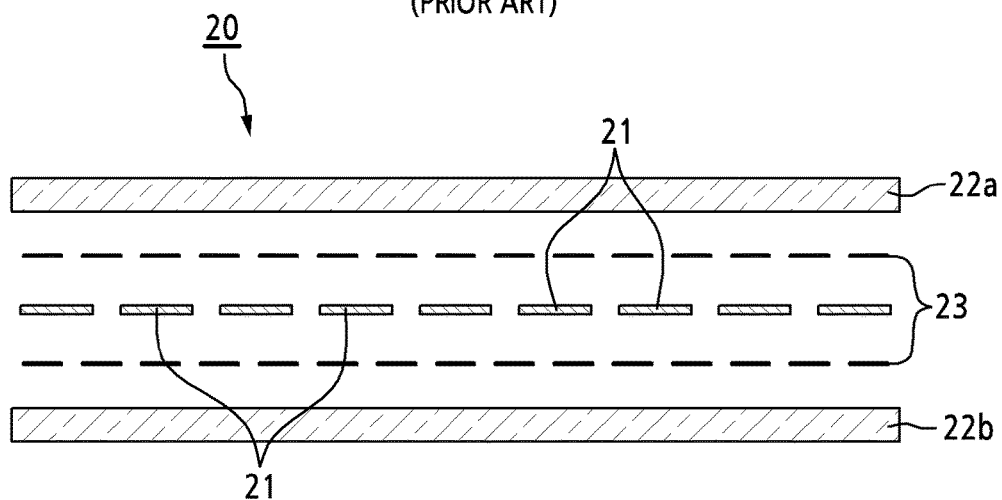
FIG. 2 is a cross-sectional view illustrating a conventional solar cell module.
Figure 3:
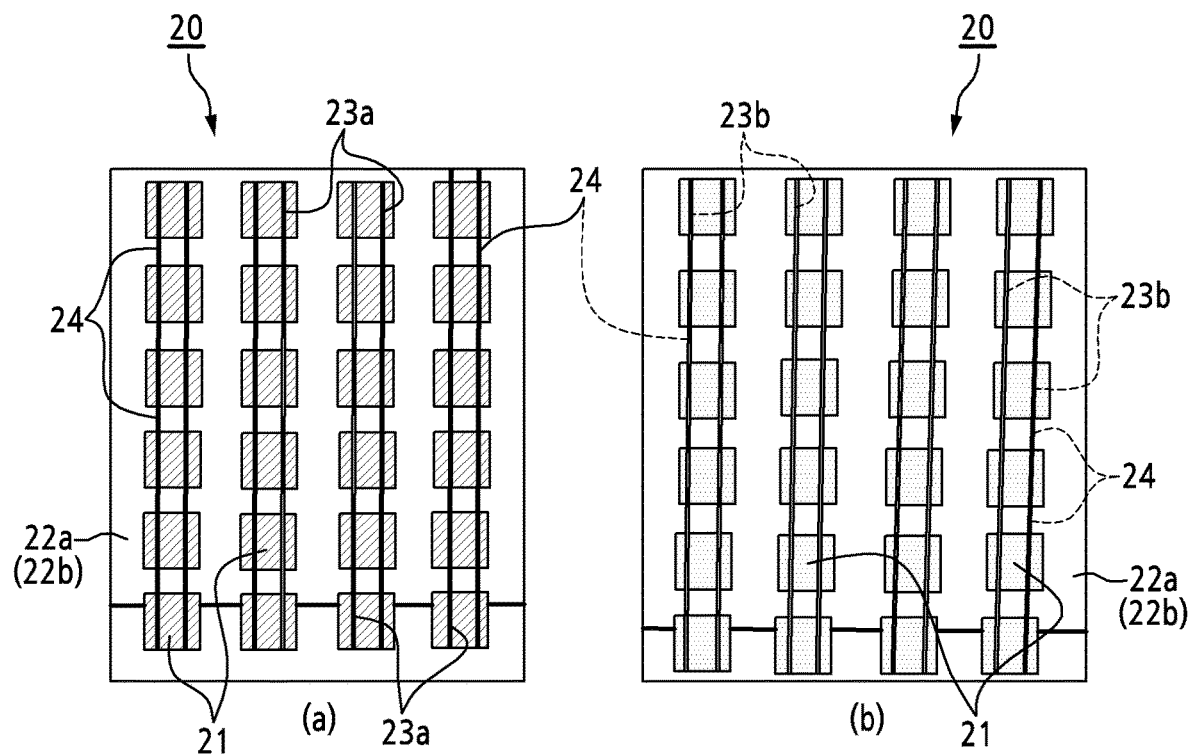
FIG. 3 is a front view illustrating a conventional solar cell module.

Hereinafter, embodiments of the present disclosure will be described in detail with reference to the accompanying drawings. The embodiments of the present disclosure may be modified in various forms, and the scope of the present disclosure should not be construed to be limited to the following embodiments. The embodiments of the present disclosure are provided to describe the present invention for those skilled in the art more completely. Accordingly, the shapes of the components of the drawings are exaggerated to emphasize clearer description thereof.

The configurations of the present disclosure for clearly describing a solution for the problem that is to be solved by the present disclosure will be described in detail with reference to the accompanying drawings based on a preferred embodiment of the present disclosure, in which the same reference numerals are given for the same elements in denoting the reference numerals for the elements even though they are present in different drawings, and when a drawing has to be referenced for a description of the embodiment, the elements in another drawing also may be cited.

Figure 4:
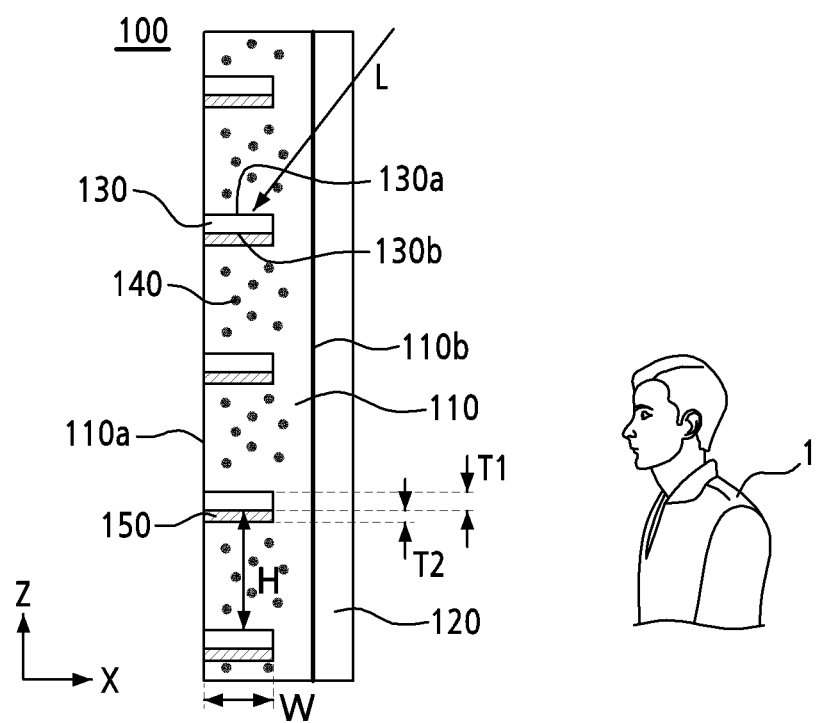
FIG. 4 is a diagram illustrating a first embodiment of a solar cell module of the present disclosure.

FIG. 4 is a diagram illustrating a first embodiment of a solar cell module of the present disclosure.

First, referring to FIG. 4, a color solar cell module 100 according to the first embodiment of the present disclosure may include a transparent substrate 110, a glass layer 120, solar cells 130, condensing parts 140, and color layers 150.

The transparent substrate 110 may have a thin film shape that has a length in a height direction (the Z axis direction), and may be formed of a light-transmitting material.

Here, the transparent substrate 110 includes one side surface 110a, and an opposite side surface 110b that is an opposite surface to the one side surface 110a, in a widthwise direction (the X axis direction).

The glass layer 120 may be joined to the opposite side surface 110b of the transparent substrate 110 to face a user 1. The glass layer 120 not only may be applied as a window while showing transparent characteristics but also may enhance an efficiency of insulation energy.

The solar cells 130 may be disposed in a shape, in which the solar cells are inserted into an interior of one side of the transparent substrate 110.

Here, the solar cells 130 may have a thin film shape with a thickness T1 and a width "W".

For example, thin film type solar cells 130 having a thickness of 10 nm to 10 μm may be applied to the solar cells 130.

In detail, the kinds of the solar cells 130 applied in the present disclosure are not limited, but silicon solar cells, thin film type solar cells, and the like may be applied in the present disclosure.

Meanwhile, the silicon solar cells may be variously classified according to thin film deposition temperatures, kinds of substrates used, and deposition schemes, and may be largely classified into multi-crystalline and crystalline silicon solar cells according to crystal characteristics of a light absorbing layer.

Here, a representative silicon solar cell is a crystal silicon solar cell (mono-crystalline and multi-crystalline), and representative structures that occupy the largest portion in the current solar cell market are a BSF structure and a PERC structure.

Furthermore, a hybrid structure is manufactured to increase a conversion efficiency to that of the crystal silicon solar cells.

Meanwhile, an amorphous silicon solar cell (a-si) is not used as a substrate during manufacturing thereof, and may be classified into a thin film type solar cell and may be deposited on a transparent substrate when being manufactured.

The solar cells 130, to which the silicon solar cells having the above characteristics are applied, are inserted into or injection-molded in the transparent substrate 110 to have transparent characteristics.

In the present disclosure, the thin film solar cells 130 are installed in a horizontal arrangement that is perpendicular to a height direction of the transparent substrate 110, and are installed in a range, in which they are neither hindered by interferences of an incident angle of sunlight nor interfered in a range of a field of view of the user 1.

Meanwhile, the solar cells 130 may include a plurality of solar cells 130 that are disposed to be spaced apart from each other in a height direction (the Z axis direction).

Here, the plurality of solar cells 130 are preferably disposed to be spaced apart from each other at an equal interval, and are installed in a horizontal arrangement in the transparent substrate 110 in a range, in which they are not interfered in a range of a field of view of the user 1.

Here, the horizontal arrangement means that they are disposed to have a width in a widthwise direction (the X axis direction) that is perpendicular to the one surface 110a of the transparent substrate 110 in an upright state in the height direction (the Z axis direction).

Meanwhile, the perpendicular relationship in the first embodiment of the present disclosure may mean that an angle therebetween is an angle (for example, 800 to 100°) that is adjacent to a right angle.

However, a range of the angle that defines the perpendicular relationship is not limited in the present disclosure.

Furthermore, a visual ray, a near-infrared ray, an ultraviolet ray passes through the transparent substrate, in the hollows between the solar cells 130.

It is apparent that the light passes through the transparent substrate 110 whereby visibility is secured and the transmission property of the transparent substrate 110 is guaranteed because there is no interference due to a field of view through gaps between the solar cells 130.

Meanwhile, the solar cells 130 may be of a double-side light reception type as described above, but in the embodiment of the present disclosure, the solar cells 130 may have light receiving parts 130a such that the light receiving parts 130a face an upper side and have non-light receiving parts 130b such that the non-light receiving parts 130b face a lower side.

That is, the solar cells 130 may be installed in a horizontal arrangement in the transparent substrate 110, and may collect the input sunlight "L" through the light receiving parts 130a formed on the upper side and may perform a photoelectric conversion.

The condensing parts 140 may be disposed in a form of a plurality of nano particles in the transparent substrate 110, and may disperse the input sunlight "L" and condense the light toward the solar cells 130, and through this, may enhance photoelectric efficiency.

Luminescent solar concentrators (LSCs) may be applied as the condensing parts 140.

The color layers 150 may be disposed in the non-light receiving parts 130b of the plurality of solar cells 130, and may have a thickness T2.

Although not illustrated, transparent adhesion layers may be interposed between the color layers 150 and the non-light receiving parts 130b of the solar cells 130 to bond the color layers 150 and the solar cells 130.

The color layers 150 may reflect a color of a specific wavelength in the input sun light "L" and transmit the lights of the remaining wavelengths to express a preset color to the outside, and thus may perform various functions, such as transmittance, colors, color rendering, and privacy protection.

Meanwhile, an existing solar cell reflects light of a specific wavelength while not absorbing the light to implement a color by itself, and thus energy production efficiency deteriorates.

That is, the color layers 150 of the color solar cell module 100 according to the embodiment of the present disclosure are manufactured separately from a process of manufacturing the solar cells 130 and are disposed in the non-light receiving parts 130b of the solar cells 130, and a photovoltaic efficiency of the solar cells 130 may not be degraded.

Meanwhile, the color layers 150 may be those, in which pigment particles that implement a specific color are dispersed.

Hereinafter, characteristics of the color solar cell module 100 according to the first embodiment of the present disclosure will be described with reference to FIGS. 5 to 8.

Figure 5A:
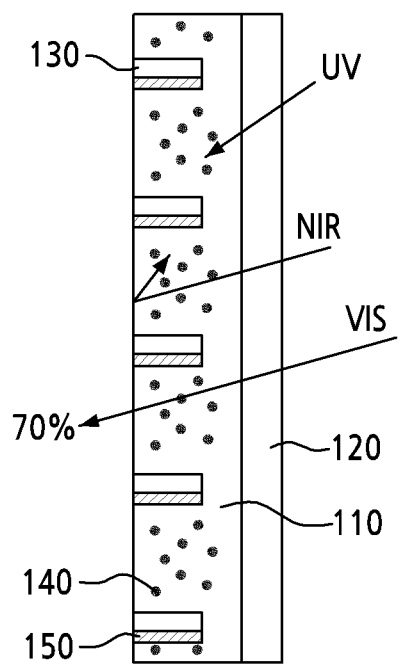
FIG. 5A is a diagram illustrating comparison of horizontal arrangement states of solar cells.
Figure 5B:
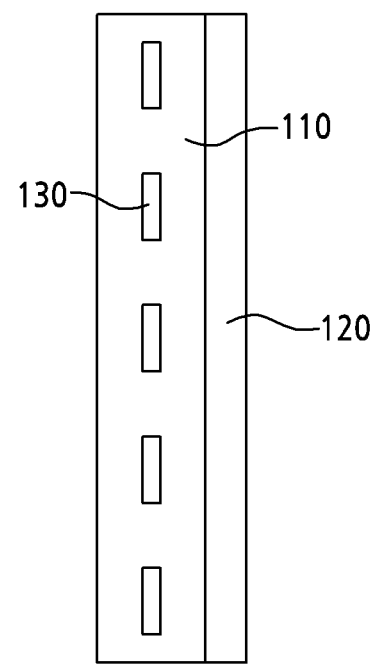
FIG. 5B is a diagram illustrating comparison of vertical arrangement states of solar cells.
Figure 6A:
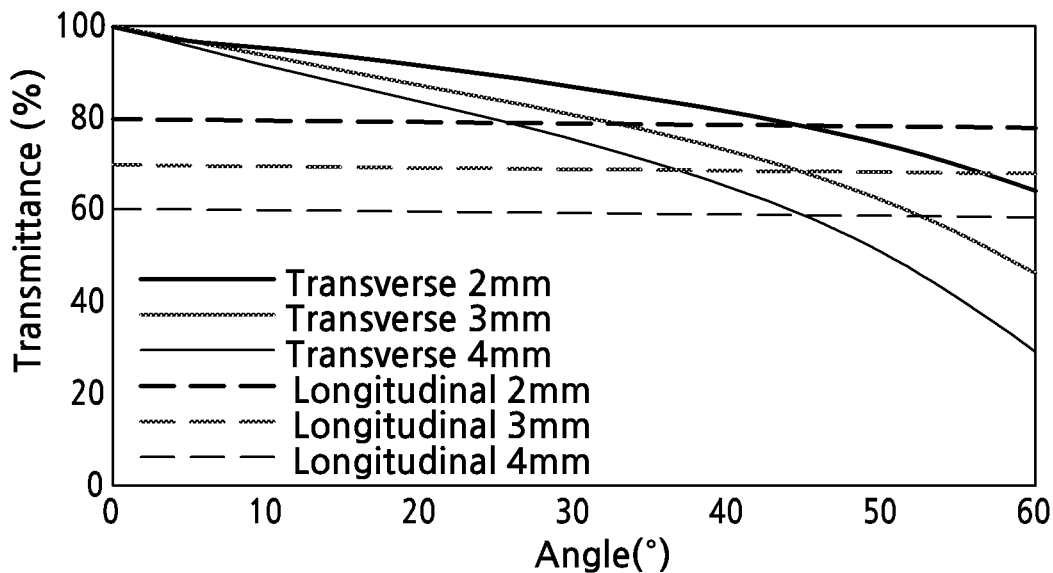
FIG. 6A is a graph depicting transmittances that vary according to a solar cell arrangement state of a solar cell module of the present disclosure.
Figure 6B:
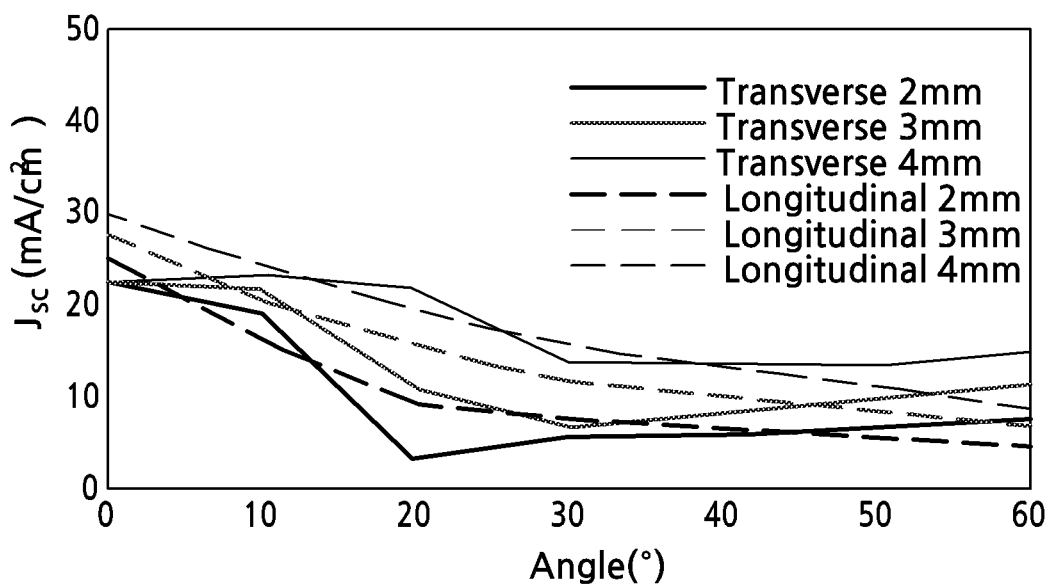
FIG. 6B is a graph depicting current densities that vary according to a solar cell arrangement state of a solar cell module of the present disclosure.
Figure 7:
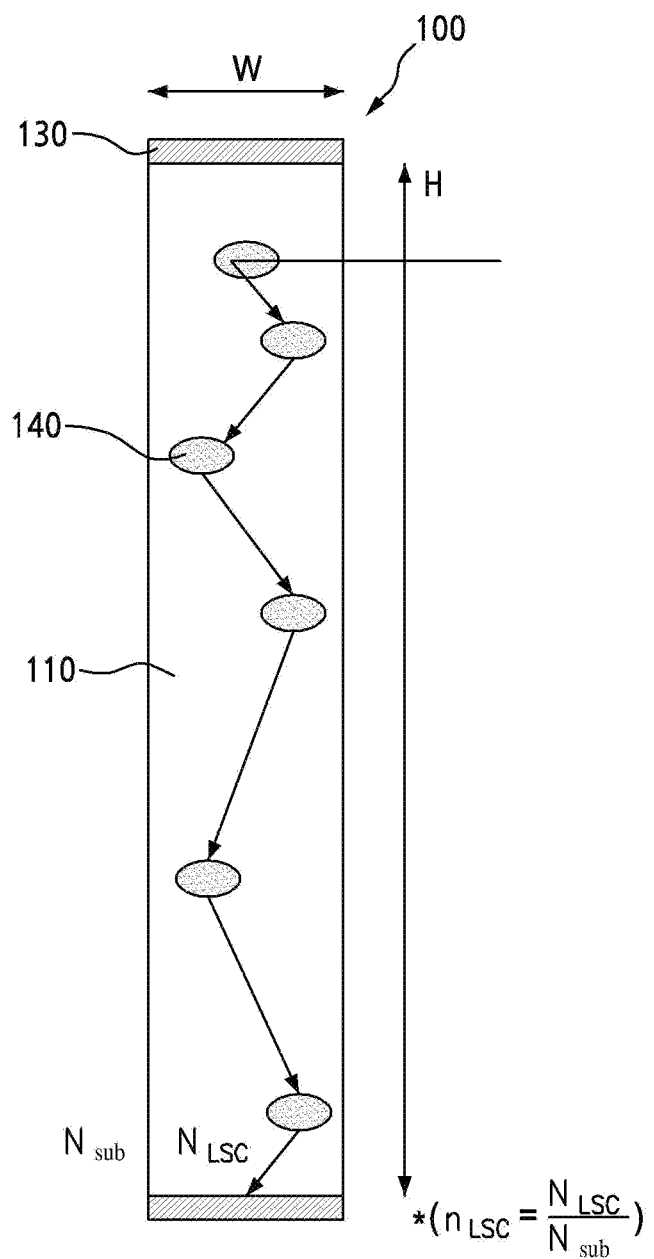
FIG. 7 is a diagram illustrating arrangement states of solar cells and condensing parts of a solar cell module of the present disclosure.
Figure 8:
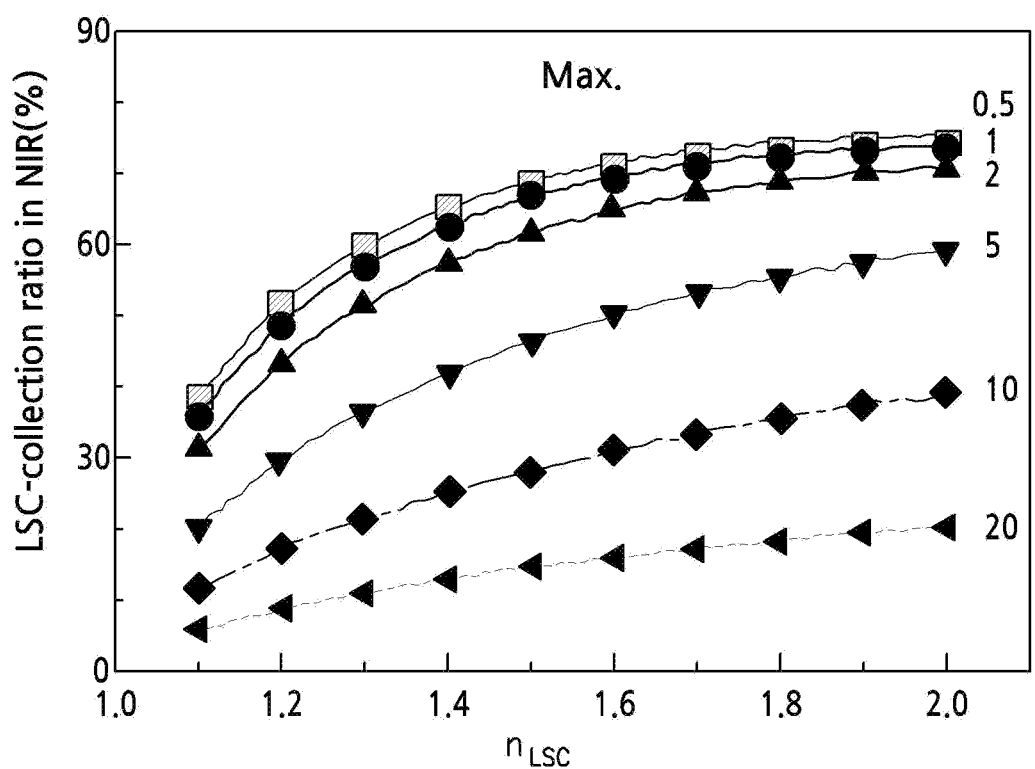
FIG. 8 is a graph depicting light collection rate states according to installation of solar cells and condensing parts of a solar cell module of the present disclosure.

FIG. 5A is a diagram illustrating comparison of horizontal arrangement states of solar cells. FIG. 5B is a diagram illustrating comparison of and vertical arrangement states of solar cells. FIG. 6A is a graph depicting transmittances and current densities that vary according to a solar cell arrangement state of a solar cell module of the present disclosure. FIG. 6B is a graph depicting current densities that vary according to a solar cell arrangement state of a solar cell module of the present disclosure. FIG. 7 is a diagram illustrating arrangement states of solar cells and condensing parts of a solar cell module of the present disclosure. FIG. 8 is a graph depicting light collection rate states according to installation of solar cells and condensing parts of a solar cell module of the present disclosure.

Referring to FIGS. 5 and 6, as in Table 1 as follows, it can be seen that condensing rates vary according to the vertical arrangement or the horizontal arrangement of the solar cells 130.

Here, an upper graph of FIG. 6 depicts a length of the cells that constitute a module and transmittances according to incident angles for the dispositions, and a lower graph of FIG. 6 depicts current density values in the same condition.

TABLE 1

| Incident angle of 0 degrees | Transverse 2 mm | Transverse 3 mm | Transverse 4 mm | Longitudinal 2 mm | Longitudinal 3 mm | Longitudinal 4 mm |
|---|---|---|---|---|---|---|
| Jsc (mA/cm$^2$) | 26.2 | 26.4 | 26.4 | 28.8 | 31.3 | 33.5 |
| Condensing rates | 3.6 | 2.4 | 1.8 | 4 | 2.9 | 2.3 |

As in Table 1, it may be seen that the condensing rate increases when the longitudinal lengths of the solar cells 130 are much larger than the transverse lengths of the solar cells 130 and thus the condensing rate becomes higher in the horizontal arrangement than in the vertical arrangement.

As a result, it is preferable that the solar cells 130 are installed in the horizontal arrangement scheme in the present disclosure.

Meanwhile, the solar cells are arranged vertically in a general solar cell module and the solar cell module is manufactured such that the solar cells are completely adhered to each other within a confined structure to increase an amount of electric power generated per unit area, but gaps are given between the solar cells in the conventional solar cell module used as a BIPV to secure a view of sight so that the solar cells may be manufactured in a vertical arrangement as in the right side of FIG. 5. Furthermore, as illustrated in FIGS. 7 and 8, it may be seen that light collection rates become lower by 20% due to losses related to scattering of the sunlight, reemission of light, and reabsorption of light as the gaps between the solar cells 130 become larger.

Consequently, the plurality of condensing parts 140 may be installed between the solar cells 130 to enhance the light collection rate.

Hereinafter, a color solar cell module according to another embodiment of the present disclosure will be described with reference to FIGS. 9 to 14.

Meanwhile, in a description of the color solar cell module according to the another embodiment of the present disclosure, only different configurations from the configurations of the color solar cell module of the prior embodiment will be described in detail, and a detailed description of the same configurations and the repeated reference numerals will be omitted.

Figure 9:
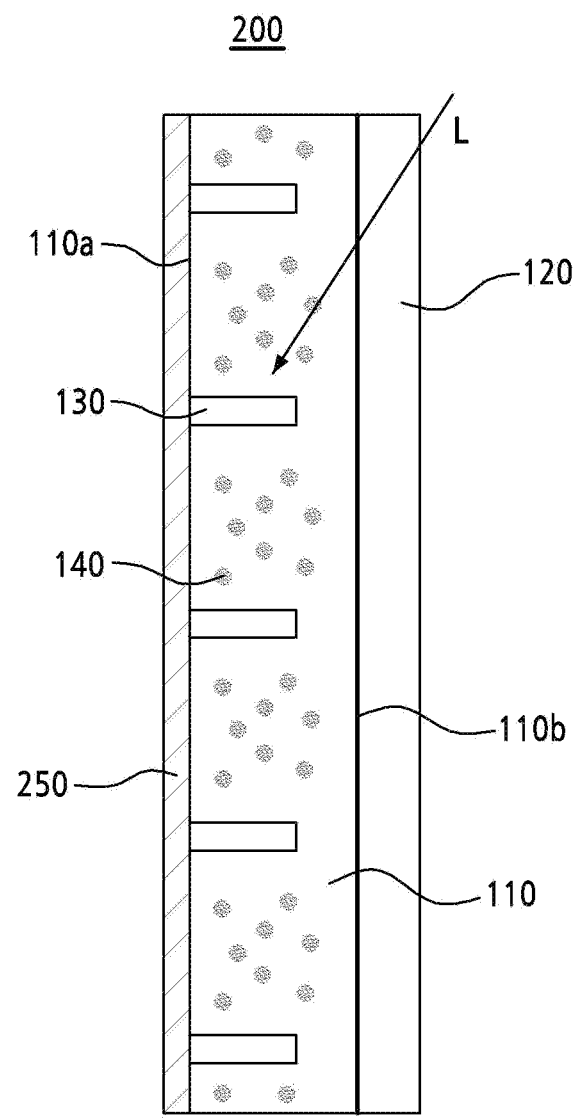
FIG. 9 is a diagram illustrating a second embodiment of a solar cell module of the present disclosure.

FIG. 9 is a diagram illustrating a second embodiment of a solar cell module of the present disclosure.

Referring to FIG. 9, a color solar cell module 200 according to the second embodiment of the present disclosure may include the transparent substrate 110, the glass layer 120, solar cells 130, condensing parts 140, and color layers 250.

Hereinafter, only the configuration of the color layers 250 will be described in detail in the description of the color solar cell module 200 according to the second embodiment of the present disclosure.

The color layers 250 may reflect a color of a specific wavelength in the input sun light "L" and transmit the lights of the remaining wavelengths to express a preset color to the outside, and thus may perform various functions, such as transmittance, colors, color rendering, and privacy protection.

The color layers 250 may be disposed along a front surface of the one side surface 110a of the transparent substrate 110.

Here, the sunlight "L" is input from the opposite side surface 110b of the transparent substrate 110. Through this, a problem, in which a specific wavelength of the sunlight "L" that is input while implementing a uniform color is not reflected by the color layers 250 before the sunlight "L" is input to the solar cells 130 so that the photovoltaic efficiency thereof is degraded, may be prevented.

That is, a height of the color layers 250 may be the same as a height of the transparent substrate 110.

Furthermore, the color layers 250 may cover surfaces of the solar cells 130, which are exposed to the one side surface 110a of the transparent substrate 110.

Meanwhile, the color layers 250 may be those, in which pigment particles that implement a specific color are dispersed.

Figure 10A:
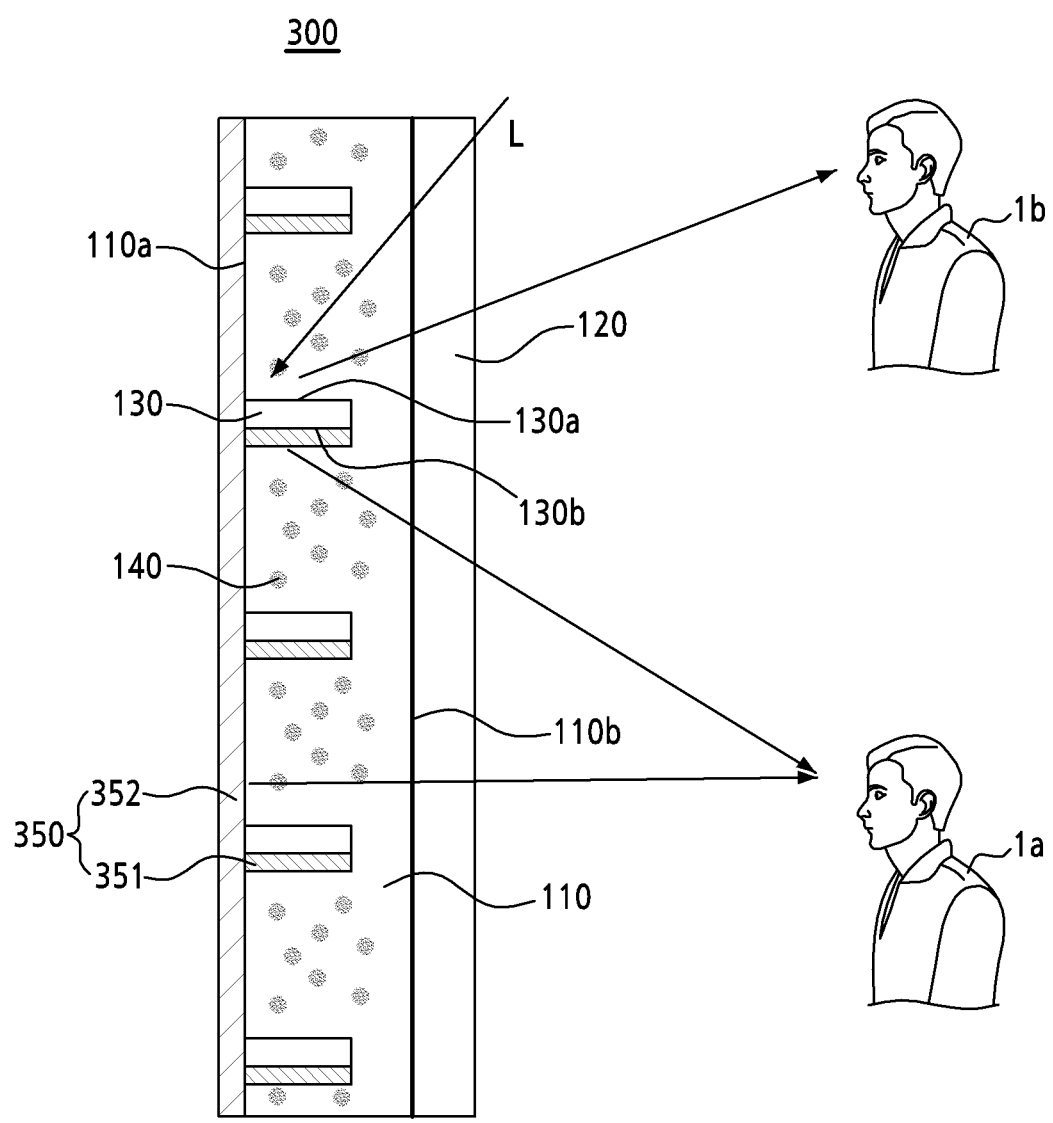
FIG. 10A is a diagram illustrating a third embodiment of a solar cell module of the present disclosure.
Figure 10B:
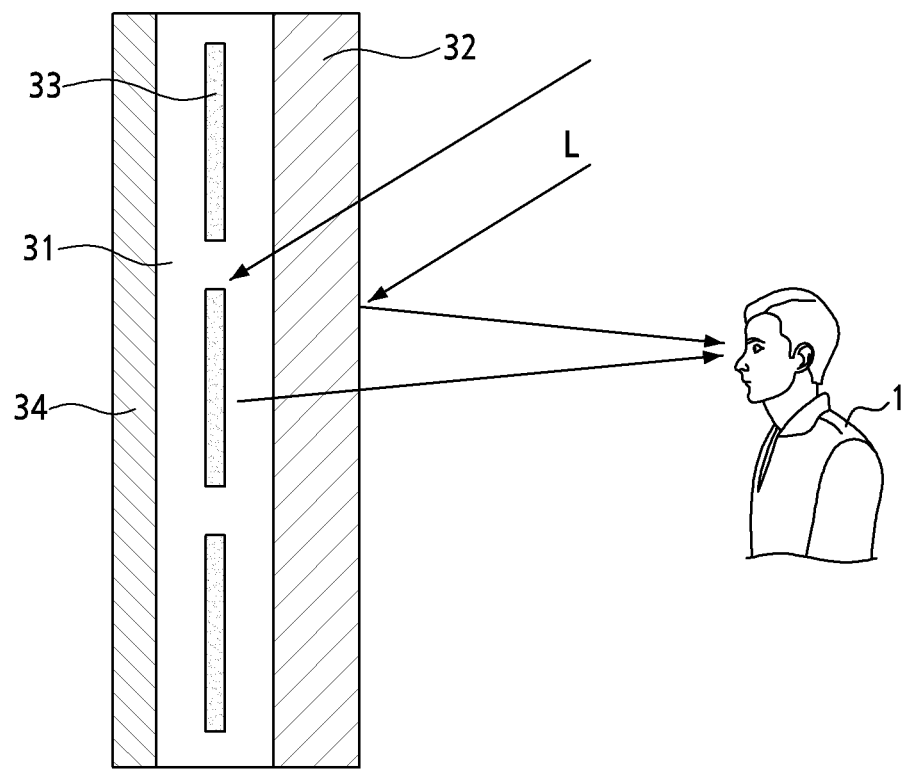
FIG. 10B is a diagram illustrating a conventional solar cell module of the present invention.

FIG. 10A is a diagram illustrating a third embodiment of a solar cell module of the present disclosure. FIG. 10B is a diagram illustrating a conventional solar cell module of the present invention.

Referring to FIG. 10A, a color solar cell module 300 according to the third embodiment of the present disclosure may include the transparent substrate 110, the glass layer 120, the solar cells 130, the condensing parts 140, and color layers 350.

Hereinafter, only the configuration of the color layers 350 will be described in detail in the description of the color solar cell module 300 according to the third embodiment of the present disclosure.

The color layers 350 may include a first color layer 351 and a second color layer 352.

The first color layer 351 and the second color layer 352 may reflect a color of a specific wavelength in the input light "L" of the sunlight and transmit the lights of the remaining wavelengths to express a preset color to the outside, and thus may perform various functions, such as transmittance, colors, color rendering, and privacy protection.

Here, the first color layer 351 and the second color layer 352 may express the same or different colors.

Meanwhile, in an area, in which the first color layer 351 and the second color layer 352 overlap each other, a color, in which the colors expressed by the first color layer 351 and the second color layer 352 are mixed, and may be expressed to an outside.

Here, the first color layer 351 may be disposed in the non-light receiving part 130b of each of the plurality of solar cells 130.

Although not illustrated, transparent adhesion layers may be interposed between the first color layers 351 and the non-light receiving parts 130b of the solar cells 130 to bond the first color layers 351 and the solar cells 130.

The second color layer 352 may be disposed along a front surface of the one side surface 110a of the transparent substrate 110.

Through this, a uniform color may be implemented.

As described above, the one side surface 110a of the transparent substrate 110 is a side, to which the sunlight "L" is input.

That is, a height of the second color layer 352 may be the same as a height of the transparent substrate 110.

Furthermore, the second color layer 352 may cover surfaces of the solar cells 130, which are exposed to the one side surface 110a of the transparent substrate 110.

Here, the sunlight "L" is input from the opposite side surface 110b of the transparent substrate 110. Through this, a problem, in which a specific wavelength of the sunlight "L" that is input while implementing a uniform color is not reflected by the color layers 250 before the sunlight "L" is input to the solar cells 130 so that the photovoltaic efficiency thereof is degraded, may be prevented.

Meanwhile, the first color layer 351 and the second color layer 352 may be those, in which pigment particles that implement the same or different colors are dispersed.

Meanwhile, in the plurality of users 1a and 1b looking at the same solar cell 130, a first user 1a looking at the non-light-receiving parts 130b of the solar cell 130 may recognize the color of the wavelength reflected from the first color layer 351. On the other hand, a second user 1b looking at the light receiving parts 130a of the solar cell 130 may recognize the color of the solar cell 130.

Referring to FIG. 10B, a conventional solar cell module of the present invention may include a transparent substrate 31, a color layer 32, solar cells 33, and a back sheet 34.

Meanwhile, referring to FIG. 10a, In the color solar cell module 300 according to the third embodiment of the present invention, after light passes through the glass layer 120 without loss, it may be absorbed by the solar cell 130a and converted into electricity. That is, the light loss due to the color layer 350 is less than 10%. On the other hand, referring to FIG. 10B, in the conventional solar cell module, since the light passing through the color layer 32 reaches the solar cell, light loss occurs by 15% to 60%, and consequently, the light reaching the solar cell is 40%~85% level.

Figure 11:
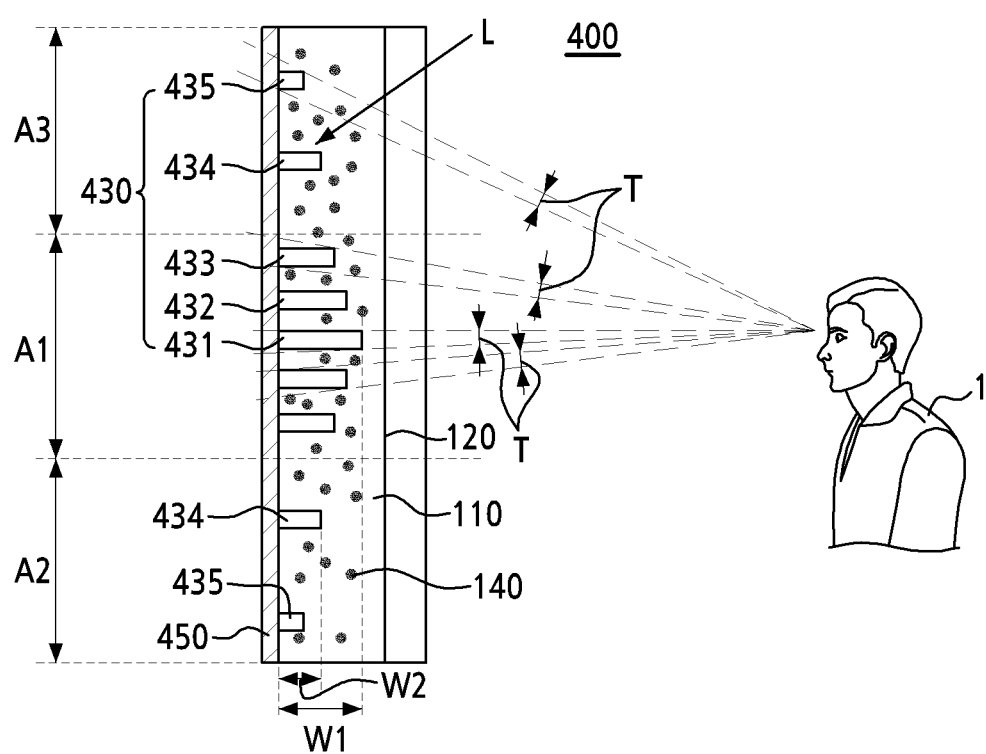
FIG. 11 is a diagram illustrating a fourth embodiment of a solar cell module of the present disclosure.

FIG. 11 is a diagram illustrating a fourth embodiment of a solar cell module of the present disclosure.

Referring to FIG. 11, a color solar cell module 400 according to the fourth embodiment of the present disclosure may include the transparent substrate 110, the glass layer 120, solar cells 430, the condensing parts 140, and color layers 450.

Hereinafter, only the configuration of the solar cell 430 and the color layers 450 will be described in detail in the description of the color solar cell module 400 according to the fourth embodiment of the present disclosure.

Here, the transparent substrate 110 is divided into an intermediate area A1, a lower area A2, and an upper area A3 in a height direction.

Here, the intermediate area A1 may be defined as an area corresponding to the head of the user 1.

For example, the intermediate area A1 may be defined as an area corresponding to a distance between 1 m to 2 m from a ground surface.

Furthermore, the lower area A2 may be defined as an area from a lower end of the transparent substrate 110 to a lower end of the intermediate area A1, and the upper area A3 may be defined as an area from an upper end of the transparent substrate 110 to an upper end of the intermediate area A1.

The solar cells 430 may include a plurality of solar cells 431, 432, 433, 444, and 435 disposed in the transparent substrate 110.

As an example, the solar cells 430 may include a plurality of solar cells 431, 432, and 433 disposed in the intermediate area A1 of the transparent substrate 110, and a plurality of solar cells 434 and 435 disposed in the lower area A2 and the upper area A3.

Here, the lower area A2 and the upper area A3 may be symmetrical to each other.

Meanwhile, a spacing distance between the plurality of solar cells 431, 432, and 433 disposed in the intermediate area A1 may be smaller than a spacing distance between the plurality of solar cells 434 and 435 disposed in the lower area A2 and the upper area A3.

That is, a density of the solar cells 431, 432, and 433 disposed in the intermediate area A1 may be higher than a density of the solar cells 434 and 435 disposed in the lower area A2 and the upper area A3.

Furthermore, a width W1 of the plurality of solar cells 431, 432, and 433 disposed in the intermediate area A1 may be larger than a width W2 of the plurality of solar cells 434 and 435 disposed in the lower area A2 and the upper area A3.

Meanwhile, the solar cells 430 have thicknesses of nano meters, and they may not be visible or may be recognized as very thin lines to the user 1 when they are viewed at the same height, but when the heights of the solar cells 430 are different from the height of the view point of the user 1, the recognized thicknesses of the solar cells 430 increases due to the width "W" of the solar cells 430, and thus the visibility may be degraded.

That is, the color solar cell module 400 according to the fourth embodiment of the present disclosure may enhance visibility by dividing the transparent substrate 110 into the intermediate area A1, the lower area A2, and the upper area A3 in the height direction with respect to the view point of the user 1, and adjusting the width of the solar cells 430 disposed in the areas A1, A2, and A3 such that the thicknesses thereof may be viewed as the thickness "T" of nano meters in the same or very similar range at the view point of the user 1.

Furthermore, the color solar cell module 400 according to the fourth embodiment of the present disclosure may enhance photoelectric efficiency without any degradation of visibility by disposing a larger number of solar cells 430 in the intermediate area A1 having a similar height to that the view point of the user 1 than in the other areas A2 and A2.

The color layers 450 may reflect a color of a specific wavelength in the input light "L" of the sunlight and transmit the lights of the remaining wavelengths to express a preset color to the outside, and thus may perform various functions, such as transmittance, colors, color rendering, and privacy protection.

The color layers 450 may be disposed along a front surface of the one side surface 110a of the transparent substrate 110.

Here, the sunlight "L" is input from the opposite side surface 110b of the transparent substrate 110. Through this, a problem, in which a specific wavelength of the sunlight "L" that is input while implementing a uniform color is not reflected by the color layers 450 before the sunlight "L" is input to the solar cells 430 so that the photovoltaic efficiency thereof is degraded, may be prevented.

Figure 12:
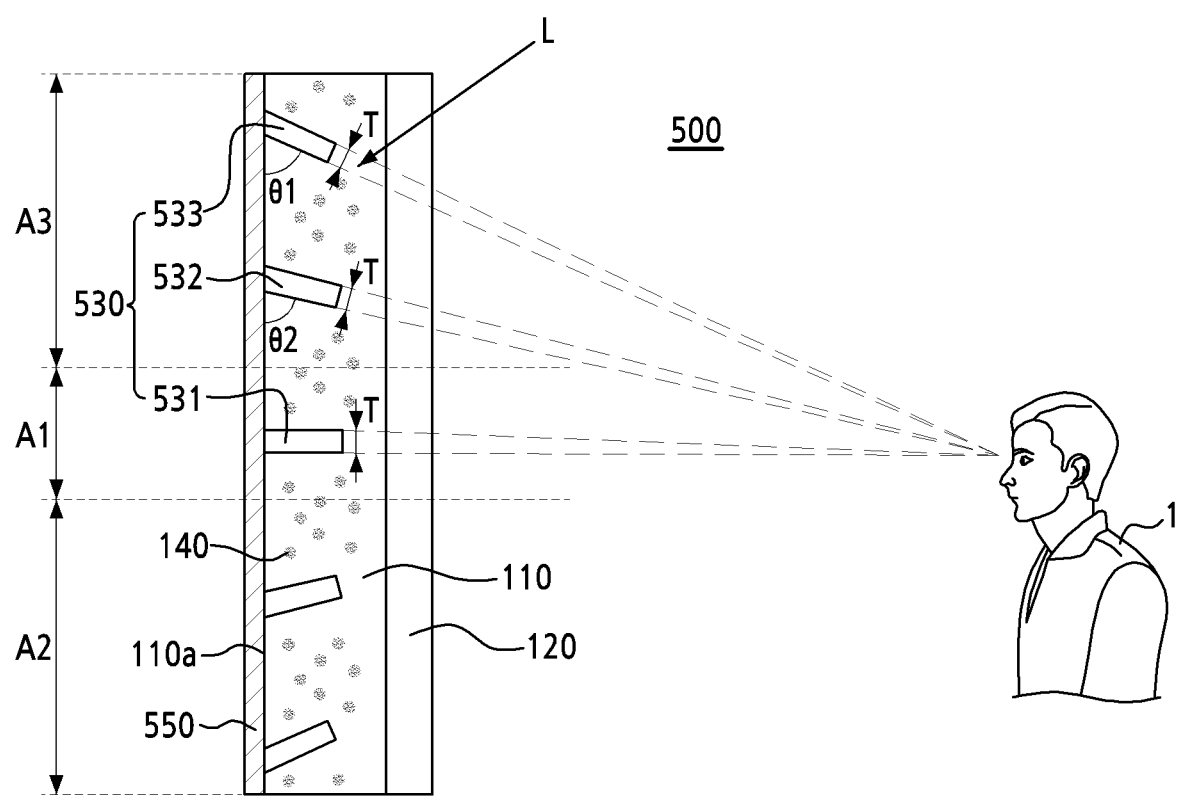
FIG. 12 is a diagram illustrating a fifth embodiment of a solar cell module of the present disclosure.

FIG. 12 is a diagram illustrating a fifth embodiment of a solar cell module of the present disclosure.

Referring to FIG. 12, a color solar cell module 500 according to the fifth embodiment of the present disclosure may include the transparent substrate 110, the glass layer 120, solar cells 530, the condensing parts 140, and color layers 550.

Hereinafter, only the configuration of the solar cell 530 and the color layers 550 will be described in detail in the description of the color solar cell module 500 according to the fifth embodiment of the present disclosure.

Here, the transparent substrate 110 is divided into the intermediate area A1, the lower area A2, and the upper area A3 in a height direction.

Here, the intermediate area A1 may be defined as an area corresponding to the head of the user 1.

For example, the intermediate area A1 may be defined as an area corresponding to a distance between 1 m to 2 m from a ground surface.

Furthermore, the lower area A2 may be defined as an area from a lower end of the transparent substrate 110 to a lower end of the intermediate area A1, and the upper area A3 may be defined as an area from an upper end of the transparent substrate 110 to an upper end of the intermediate area A1.

The solar cells 530 may include a plurality of solar cells 531, 532, and 533 disposed in the transparent substrate 110.

As an example, the solar cells 530 may include a plurality of solar cells 531 disposed in the intermediate area A1 of the transparent substrate 110, and a plurality of solar cells 532 and 533 disposed in the lower area A2 and the upper area A3.

Here, the lower area A2 and the upper area A3 may be symmetrical to each other.

Meanwhile, the plurality of solar cells 531 disposed in the intermediate area A1 may be installed in a horizontal arrangement that is perpendicular to a height direction of the transparent substrate 110, and the plurality of solar cells 532 and 533 disposed in the lower area A2 and the upper area A3 may be disposed to face the intermediate area A1 to have a preset angle.

Here, angles θ1 and θ2 defined by the plurality of solar cells 532 and 533 disposed in the lower area A2 and the upper area A3 and the one side surface 110a of the transparent substrate 110 may be acute angles.

Furthermore, the angle θ1 defined by the solar cells 532 disposed to be closer to the intermediate area A1 and the one side 110a of the transparent substrate 110 may be larger than the angle θ2 defined by the solar cells 533 disposed to be farther from the intermediate area A1 and the one side surface 110a of the transparent substrate 110.

This arrangement, as illustrated in FIG. 12, may be one, in which the plurality of solar cells 531, 532, and 533 are rotated to face the view point of the user 1.

Meanwhile, the solar cells 530 have thicknesses of nano meters, and they may not be visible or may be recognized as very thin lines to the user 1 when they are viewed at the same height, but when the heights of the solar cells 530 are different from the height of the view point of the user 1, the recognized thicknesses of the solar cells 530 increases due to the width "W" of the solar cells 530, and thus the visibility may be degraded.

That is, the color solar cell module 500 according to the fifth embodiment of the present disclosure may enhance visibility by dividing the transparent substrate 110 into the intermediate area A1, the lower area A2, and the upper area A3 in the height direction with respect to the view point of the user 1, and adjusting the disposition angle of the solar cells 530 disposed in the areas A1, A2, and A3 such that the thicknesses thereof may be viewed as the thickness "T" of nano meters in the same or very similar range at the view point of the user 1.

The color layers 550 may reflect a color of a specific wavelength in the input light "L" of the sunlight and transmit the lights of the remaining wavelengths to express a preset color to the outside, and thus may perform various functions, such as transmittance, colors, color rendering, and privacy protection.

The color layers 550 may be disposed along a front surface of the one side surface 110a of the transparent substrate 110.

Here, the sunlight "L" is input from the opposite side surface 110b of the transparent substrate 110. Through this, a problem, in which a specific wavelength of the sunlight "L" that is input while implementing a uniform color is not reflected by the color layers 550 before the sunlight "L" is input to the solar cells 530 so that the photovoltaic efficiency thereof is degraded, may be prevented.

Figure 13:
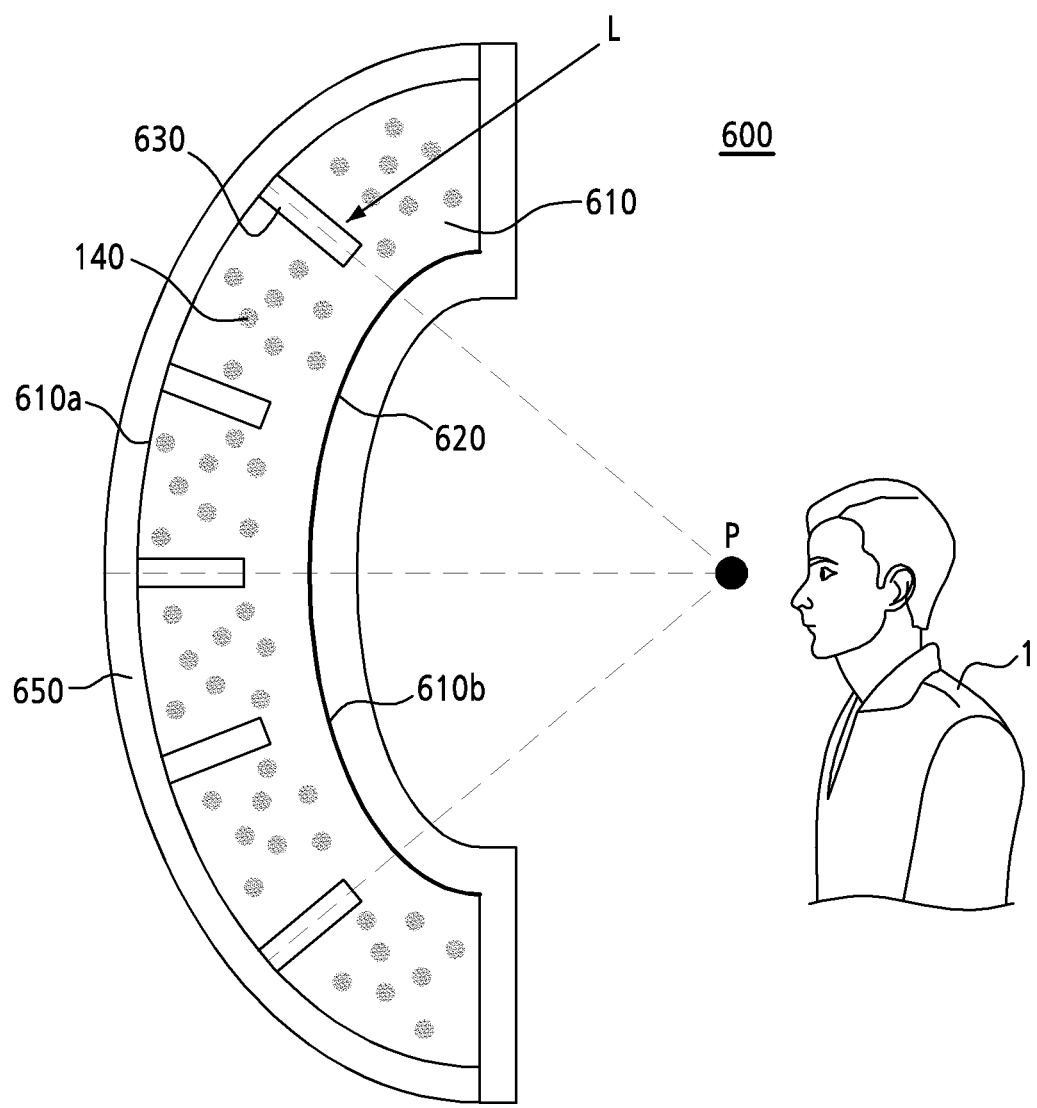
FIG. 13 is a diagram illustrating a sixth embodiment of a solar cell module of the present disclosure.

FIG. 13 is a diagram illustrating a sixth embodiment of a solar cell module of the present disclosure.

Referring to FIG. 13, a color solar cell module 600 according to the sixth embodiment of the present disclosure may include a transparent substrate 610, a glass layer 620, solar cells 630, condensing parts 140, and color layers 650.

Hereinafter, only the configuration of the transparent substrate 610, the glass layer 620, the solar cells 630, and the color layers 650 will be described in detail in the description of the color solar cell module 600 according to the fourth embodiment of the present disclosure.

Here, the transparent substrate 610 may have a fan shape that has a preset radius of curvature with respect to an origin "P".

That is, one side surface 610a and an opposite side surface 610b of the transparent substrate 610 may have an arc.

The glass layer 620 may be disposed on the opposite side surface 610b to cover the opposite side surface 610b of the transparent substrate 610.

The solar cells 630 may be disposed to be inserted into the one side surface 610a of the transparent substrate 610, and may include a plurality of solar cells 630.

Here, the solar cells 630 may be disposed on an imaginary line that extends from the one side surface 610a of the transparent substrate 610 to the origin "P".

That is, the solar cells 630 may be disposed to face the origin "P".

Here, the origin "P" may have a similar height to the view point of the user 1.

Meanwhile, the solar cells 630 have thicknesses of several nano meters to several micro meters, and they may not be visible or may be recognized as very thin lines to the user 1 when they are viewed at the same height, but when the heights of the solar cells 630 are different from the height of the view point of the user 1, the recognized thicknesses of the solar cells 630 increases due to the width "W" of the solar cells 630, and thus the visibility may be degraded.

That is, the solar cell module 600 according to the sixth embodiment of the present disclosure may enhance visibility by adjusting the disposition angle of the solar cells 630 disposed in the transparent substrate 610 of the fan shape in the same direction with respect to the view point of the user 1 such that the thicknesses thereof may be viewed as the thickness "T" of nano meters in the same or very similar range at the view point of the user 1.

The color layers 650 may reflect a color of a specific wavelength in the input light "L" of the sunlight and transmit the lights of the remaining wavelengths to express a preset color to the outside, and thus may perform various functions, such as transmittance, colors, color rendering, and privacy protection.

The color layers 650 may be disposed along a front surface of the one side surface 610a of the transparent substrate 610.

Here, the sunlight "L" is input from the opposite side surface 610b of the transparent substrate 610. Through this, a problem, in which a specific wavelength of the sunlight "L" that is input while implementing a uniform color is not reflected by the color layers 650 before the sunlight "L" is input to the solar cells 630 so that the photovoltaic efficiency thereof is degraded, may be prevented.

Figure 14:
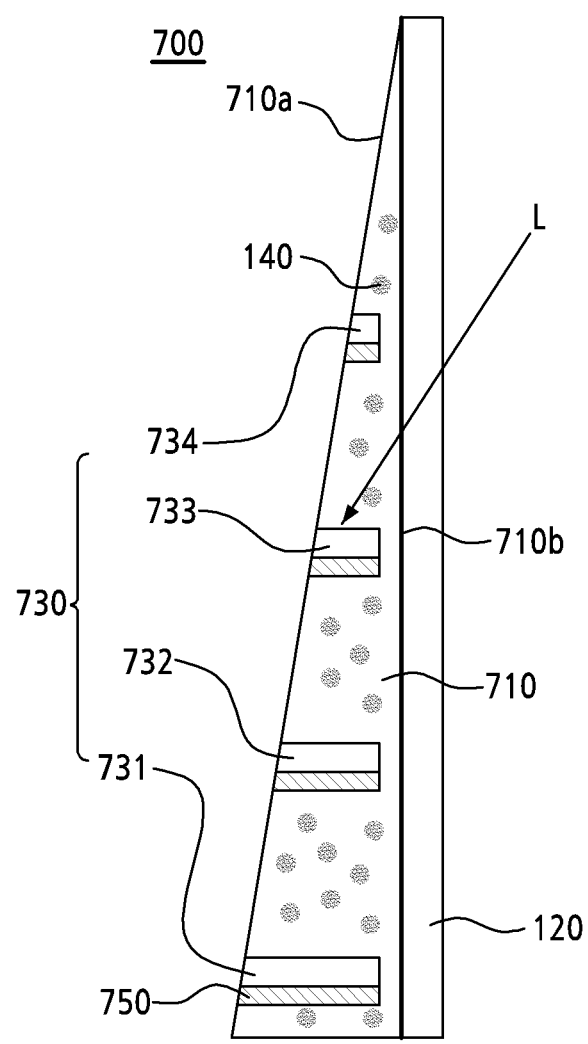
FIG. 14 is a diagram illustrating a seventh embodiment of a solar cell module of the present disclosure.

FIG. 14 is a diagram illustrating a seventh embodiment of a solar cell module of the present disclosure.

Referring to FIG. 14, a color solar cell module 700 according to the seventh embodiment of the present disclosure may include a transparent substrate 710, the glass layer 120, solar cells 730, condensing parts 740, and color layers 750.

Hereinafter, only the configuration of the transparent substrate 710, the solar cell 730, and the color layers 750 will be described in detail in the description of the color solar cell module 700 according to the seventh embodiment of the present disclosure.

Here, the transparent substrate 710 may have one side surface 710a that is inclined, and an opposite side surface 710b on an opposite side thereof.

The solar cells 730 may be disposed to be inserted into the one side surface 710a of the transparent substrate 710, and may include a plurality of solar cells 731, 732, 733, and 734.

Here, the plurality of solar cells 730 may have different widths according to an inclination of the one side surface 710a of the transparent substrate 710.

That is, in the color solar cell module 700 according to the seventh embodiment of the present disclosure, the photovoltaic efficiency thereof may be maintained or enhanced because the shapes of the plurality of solar cells 730 are deformed even though the shape of the transparent substrate 710 is deformed.

Figure 15:
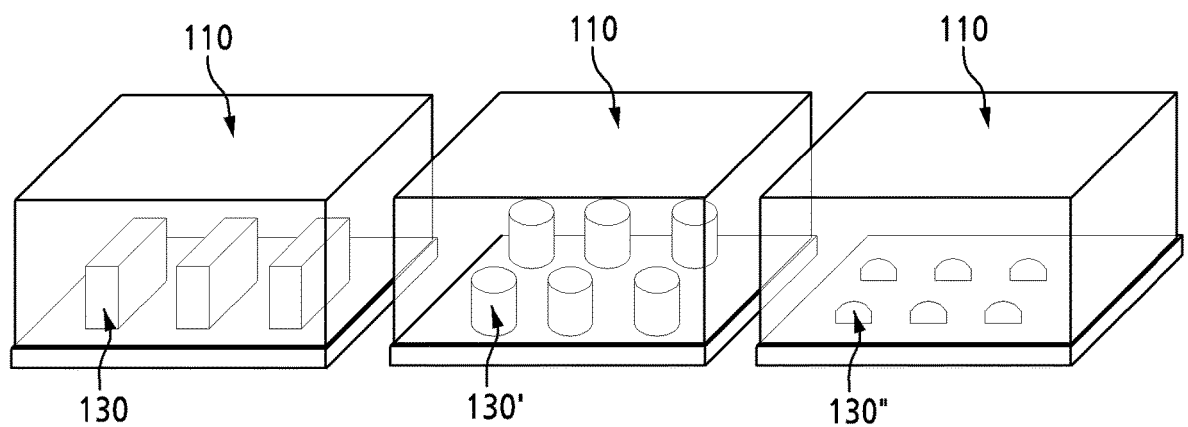
FIG. 15 is a diagram illustrating an eighth embodiment of a solar cell module of the present disclosure.

FIG. 15 is a diagram illustrating an eighth embodiment of a solar cell module of the present disclosure.

Referring to FIG. 15, configurations of the solar cells 130, 130', and 130" of the color solar cell module according to the eighth embodiment of the present disclosure may be partially different.

Here, the solar cells 130 may have a ribbon shape, the solar cells 130' may have a micro or nano line shape, or the solar cells 130" may have a semispherical shape, but the present disclosure is not limited thereto in detail.

The above detailed description exemplifies the present disclosure. Furthermore, the above-mentioned contents describe the exemplary embodiment of the present disclosure, and the present disclosure may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the present disclosure, and various changes required in the detailed application fields and purposes of the present disclosure can be made. Accordingly, the detailed description of the present disclosure is not intended to restrict the present invention in the disclosed embodiment state. Furthermore, it should be construed that the attached claims include other embodiments.

DESCRIPTION OF REFERENCE NUMERALS 100, 200, 300, 400, 500, 600, 700: color solar cell module
110: transparent substrate
120: glass layer
130: solar cell
140: condensing part
150: color layer

The invention claimed is:

1. A color solar cell module comprising:
a transparent substrate;
a plurality of solar cells disposed in an interior of the transparent substrate and adjacent to one side surface of the transparent substrate and detached from an opposite side surface of the transparent substrate, wherein each solar cell of the plurality of solar cells has a light receiving part; and
a plurality of color layers,
wherein
each color layer of the plurality of color layers is disposed on a surface of each corresponding solar cell of the plurality of solar cells and is disposed on an opposite side surface of the light receiving part,
the plurality of solar cells and the plurality of color layers are disposed to be perpendicular to the one side surface of the transparent substrate, and
each color layer of the plurality of color layers permits a transmission of sunlight across a first wavelength range and a reflection of sunlight across a second wavelength range.

2. The color solar cell module of claim 1, wherein
the transparent substrate is divided into an intermediate area, a lower area, and an upper area in a height direction.

3. The color solar cell module of claim 2, wherein the solar cells disposed on the lower area and the upper area are disposed to be inclined toward the intermediate area.

4. The color solar cell module of claim 1,
wherein the transparent substrate is divided into an intermediate area, a lower area, and an upper area in a height direction, and
wherein a density of the solar cells disposed in the intermediate area is higher than a density of the solar cells disposed in the lower area and the upper area.

5. The color solar cell module of claim 1,
wherein the transparent substrate is divided into an intermediate area, a lower area, and an upper area in a height direction, and
wherein widths of the solar cells disposed in the intermediate area are larger than widths of the solar cells disposed in the lower area and the upper area.

6. The color solar cell module of claim 1,
wherein the one side surface of the transparent substrate is curved.

7. The color solar cell module of claim 1,
wherein the one side surface of the transparent substrate is inclined.

8. The color solar cell module of claim 1, further comprising:
a glass layer disposed on the opposite side surface of the transparent substrate.

9. The color solar cell module of claim 8, further comprising:
a condensing part disposed in the transparent substrate.

10. A color solar cell module comprising:
a transparent substrate;
a plurality of solar cells disposed in an interior of the transparent substrate and adjacent to one side surface of the transparent substrate and detached from an opposite side surface of the transparent substrate, wherein each solar cell of the plurality of solar cells has a light receiving part; and
a color layer disposed on the one side surface of the transparent substrate,
wherein
the plurality of solar cells are disposed to be perpendicular to the one side surface of the transparent substrate, and
sunlight is input through the opposite side surface of the transparent substrate.

11. A color solar cell module comprising:
a transparent substrate;
a plurality of solar cells disposed in an interior of the transparent substrate and adjacent to one side surface of the transparent substrate and detached from an opposite side surface of the transparent substrate, wherein each solar cell of the plurality of solar cells has a light receiving part, and wherein the plurality of solar cells are disposed to be perpendicular to the one side surface of the transparent substrate;
a plurality of first color layers disposed on each corresponding solar cell of the plurality of solar cells and disposed on an opposite side surface of the light receiving part; and
a second color layer disposed on the one side surface of the transparent substrate,
wherein
the plurality of solar cells and the plurality of first color layers are disposed to be perpendicular to the one side surface of the transparent substrate,
sunlight is input through the opposite side surface of the transparent substrate, and
the plurality of the first color layer permits a transmission of sunlight across a first wavelength range and a reflection of sunlight across a second wavelength range.

12. The color solar cell module of claim 11, wherein the first color layer and the second color layer have the same color.

13. The color solar cell module of claim 11, wherein the first color layer is different in color from the second color layer.

* * * * *